(12) United States Patent
Oh et al.

(10) Patent No.: US 10,658,615 B2
(45) Date of Patent: May 19, 2020

(54) DISPLAY DEVICE

(71) Applicant: Samsung Display Co., Ltd., Yongin-Si, Gyeonggi-Do (KR)

(72) Inventors: Hyunjoon Oh, Seongnam-si (KR); Kyungtae Kim, Asan-si (KR); Boa Kim, Icheon-si (KR); Sanghoon Kim, Hwaseong-si (KR); Sang-il Park, Yongin-si (KR); Heonjung Shin, Hwaseong-si (KR); Hye-jin Oh, Asan-si (KR); Jeoungsub Lee, Seoul (KR); Min-hoon Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 35 days.

(21) Appl. No.: 15/837,293

(22) Filed: Dec. 11, 2017

(65) Prior Publication Data

US 2018/0248150 A1 Aug. 30, 2018

(30) Foreign Application Priority Data

Feb. 24, 2017 (KR) .................. 10-2017-0024942

(51) Int. Cl.
*H01L 51/52* (2006.01)
*H01L 27/32* (2006.01)

(52) U.S. Cl.
CPC ........ *H01L 51/5253* (2013.01); *H01L 27/323* (2013.01); *H01L 51/5281* (2013.01); *H01L 51/5284* (2013.01); *H01L 27/3244* (2013.01); *H01L 2251/5338* (2013.01); *H01L 2251/558* (2013.01)

(58) Field of Classification Search
CPC ......... H01L 51/5253; H01L 2251/5338; G09F 9/301
See application file for complete search history.

(56) References Cited

U.S. PATENT DOCUMENTS

| 8,609,230 | B2 * | 12/2013 | Yamamoto | B05D 7/52 |
| | | | | 428/212 |
| 9,051,493 | B2 | 6/2015 | Bower et al. | |
| 9,189,027 | B2 | 11/2015 | Lee et al. | |
| 2014/0146279 | A1 * | 5/2014 | Kim | G02B 1/105 |
| | | | | 349/122 |
| 2014/0234599 | A1 * | 8/2014 | Chung | G02F 1/133305 |
| | | | | 428/212 |
| 2014/0308499 | A1 | 10/2014 | Kim et al. | |
| 2014/0367644 | A1 * | 12/2014 | Song | H01L 51/0097 |
| | | | | 257/40 |
| 2015/0093568 | A1 | 4/2015 | Kim et al. | |
| 2015/0285964 | A1 * | 10/2015 | Yim | G02B 5/0294 |
| | | | | 359/599 |

(Continued)

FOREIGN PATENT DOCUMENTS

| JP | 2015020289 A | 2/2015 |
| KR | 1020150009318 A | 1/2015 |

(Continued)

*Primary Examiner* — Bac H Au
(74) *Attorney, Agent, or Firm* — Cantor Colburn LLP

(57) ABSTRACT

A display device includes a display panel and a window coating layer disposed directly on an upper surface of the display panel. The window coating layer includes a first region which has an increasing elastic modulus in a direction from the display panel toward the window coating layer.

20 Claims, 13 Drawing Sheets

(56) References Cited

U.S. PATENT DOCUMENTS

| | | | | |
|---|---|---|---|---|
| 2016/0209550 A1* | 7/2016 | Jeong | ............... | G02B 1/14 |
| 2016/0211482 A1 | 7/2016 | Namkung | | |
| 2016/0306392 A1* | 10/2016 | Park | ............... | G06F 1/1652 |
| 2017/0084673 A1* | 3/2017 | Lee | ............... | H01L 27/3244 |
| 2017/0187856 A1* | 6/2017 | Kim | ............... | H04M 1/185 |
| 2017/0309867 A1* | 10/2017 | Mun | ............... | C09J 133/08 |

FOREIGN PATENT DOCUMENTS

| | | |
|---|---|---|
| KR | 1020160028174 A | 3/2016 |
| KR | 1020160089009 A | 7/2016 |

\* cited by examiner

DISPLAY DEVICE

This application claims priority to Korean Patent Application No. 10-2017-0024942, filed on Feb. 24, 2017, and all the benefits accruing therefrom under 35 U.S.C. § 119, the content of which in its entirety is herein incorporated by reference.

BACKGROUND

1. Field

The disclosure relates to a display device, and in particular, to a display device including a window coating layer, which directly covers an upper surface of a display panel of the display device.

2. Description of the Related Art

Recently, as the interest and demand for a portable device of displaying and storing information has increased, various research has been extensively conducted to commercialize a lightweight thin flat panel display ("FPD"), which can be used to replace a conventional display device such as a cathode ray tube ("CRT") display.

The display device is typically configured to display various images on its display screen and is used to provide information to a user. Recently, a bendable display device is being developed. A flexible display device, unlike the flat panel display, may be folded or rolled, like a piece of paper such that portability and user convenience thereof are improved, because the shape of the flexible display device can be variously changed. The flexible display device is typically classified into foldable and rollable display devices.

SUMMARY

Some embodiments of the disclosure provide a display device including a window coating layer with high durability and to effectively prevent a delamination issue, which may occur during a bending step.

According to some embodiments of the disclosure, a display device includes a display panel and a window coating layer disposed directly on an upper surface of the display panel. In such embodiments, the window coating layer includes a first region which has an increasing elastic modulus in a direction from the display panel toward the window coating layer.

In some embodiments, the window coating layer may include two or more kinds of base resin.

In some embodiments, the window coating layer may further include a second region and a third region, which are spaced apart from each other with the first region interposed therebetween, and each of the second region and the third region may have a constant elastic modulus.

In some embodiments, the second region may have an elastic modulus in a range from about 1 gigapascal (GPa) to about 10 GPa, and the third region may have an elastic modulus in a range from about 1 megapascal (MPa) to about 100 MPa.

In some embodiments, the second region may have a thickness in a range from about 5 micrometers (μm) to about 20 μm.

In some embodiments, the window coating layer may have a thickness in a range from about 50 μm to about 1 mm.

In some embodiments, the window coating layer may have a thickness in a range from about 100 μm to about 500 μm.

In some embodiments, the window coating layer may have a single-layer structure.

In some embodiments, the window coating layer may include an ultraviolet absorber.

In some embodiments, an upper surface of the window coating layer may define irregular bumpy patterns.

In some embodiments, the display panel may include a base layer, a pixel layer disposed on the base layer and which displays an image, an input-sensing layer disposed on the pixel layer and which senses an external input, and an anti-reflection layer disposed on the pixel layer and which effectively prevent reflection of external light. In such embodiments, the window coating layer may be disposed directly on an upper surface of the outermost layer of the input-sensing layer and the anti-reflection layer.

In some embodiments, the display device may further include a first curl prevention pattern, which is disposed directly on the upper surface of the display panel, is in contact with the window coating layer, and which prevents a curl of the window coating layer.

In some embodiments, the first curl prevention pattern may be covered with the window coating layer.

In some embodiments, the display device may further include a base coating layer directly provided on a lower surface of the display panel.

In some embodiments, the base coating layer may include a single kind of a base resin.

In some embodiments, the display device may be operated in a first mode, in which at least a portion of the display device is bent, or in a second mode, in which the display device is flat.

According to some embodiments of the disclosure, a display device may include a display panel and a window coating layer disposed on an upper surface of the display panel. In such embodiments, the window coating layer has a single-layer structure and has a plurality of elastic moduli.

In some embodiments, the window coating layer may include a first region having an increasing elastic modulus in a direction from the display panel toward the window coating layer.

In some embodiments, the window coating layer may include two or more kinds of base resins.

BRIEF DESCRIPTION OF THE DRAWINGS

Exemplary embodiments will be more clearly understood from the following brief description taken in conjunction with the accompanying drawings. The accompanying drawings illustrate non-limiting, exemplary embodiments as described herein.

DETAILED DESCRIPTION

Figure 1:
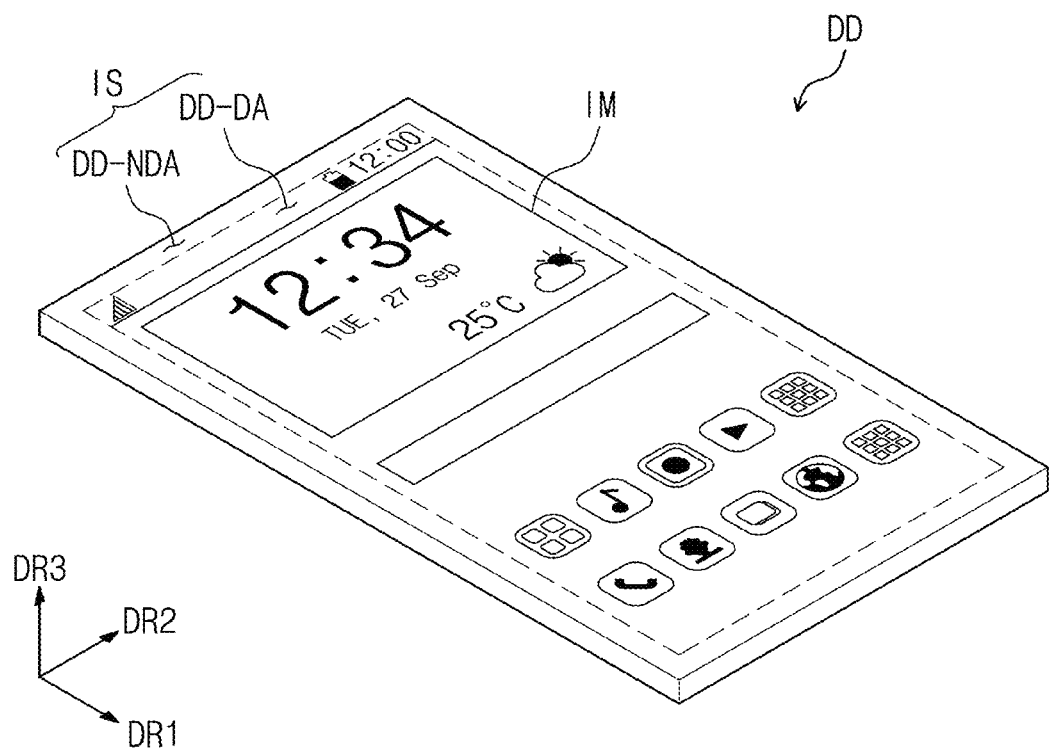
FIG. 1 is a perspective view illustrating a display device according to some embodiments of the disclosure.

Exemplary embodiments of the disclosures will now be described more fully with reference to the accompanying drawings, in which exemplary embodiments are shown. Exemplary embodiments of the disclosures may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description may be omitted or simplified.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. "Or" means "and/or." As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which exemplary embodiments of the disclosures belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a display device according to some embodiments of the disclosure.

Referring to FIG. 1, an embodiment of a display device DD may include a display surface IS, on which an image IM is displayed. In an embodiment, the display surface IS is placed to be parallel to a first direction axis DR1 and a second direction axis DR2 and is normal to a third direction axis DR3, and the third direction axis DR3 may be referred to as a thickness direction of the display device DD. The third direction axis DR3 may be used as the basis for differentiating an upper or top surface of each element from a lower or bottom surface. However, the first to third direction axes DR1, DR2, and DR3 may be used to represent three different directions, and angles therebetween may be variously changed. Furthermore, a term 'first, second, or third direction' may be used to represent the same direction as that denoted by each of the first to third direction axes DR1, DR2, and DR3. According to some embodiments of the disclosure, the display device DD may be a flexible display device. The disclosure is not limited thereto, and the display device DD is a rigid display device.

The display device DD may be a foldable or rollable display device, but the disclosure is not limited thereto. The display device DD may be used for large-sized electronic devices (e.g., television sets and monitors) or small- or medium-sized electronic devices (e.g., mobile phones, tablets, car navigation systems, game machines, and smart watches).

In an embodiment, as shown in FIG. 1, the display surface IS of the display device DD may include a plurality of regions. The display device DD may include a display region DD-DA for displaying an image IM and a non-display region DD-NDA adjacent to the display region DD-DA. The non-display region DD-NDA may be configured not to display any image. In such an embodiment, as shown in FIG. 1, the image IM may be displayed in the form of graphical user interface including application icons and a clock widget, for example. The display region DD-DA may have a rectangle-like shape or a square-like shape. The non-display region DD-NDA may be provided to enclose the display region DD-DA. However, the disclosure is not limited thereto, and the shapes of the display and non-display regions DD-DA and DD-NDA may be variously defined in the display device DD.

In some embodiments, the display device DD may include a housing (not shown). The housing may define an outer region of the display device DD and may be used to contain components.

Figure 2A:
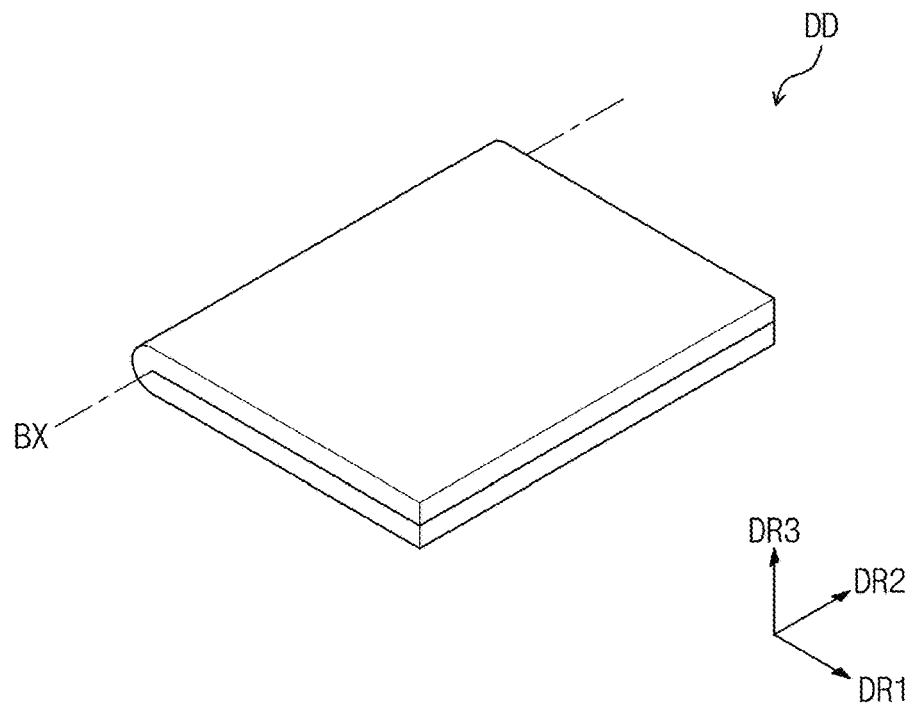
FIGS. 2A and 2B are perspective views, each of which illustrates a folded structure of the display device of FIG. 1.
Figure 2B:
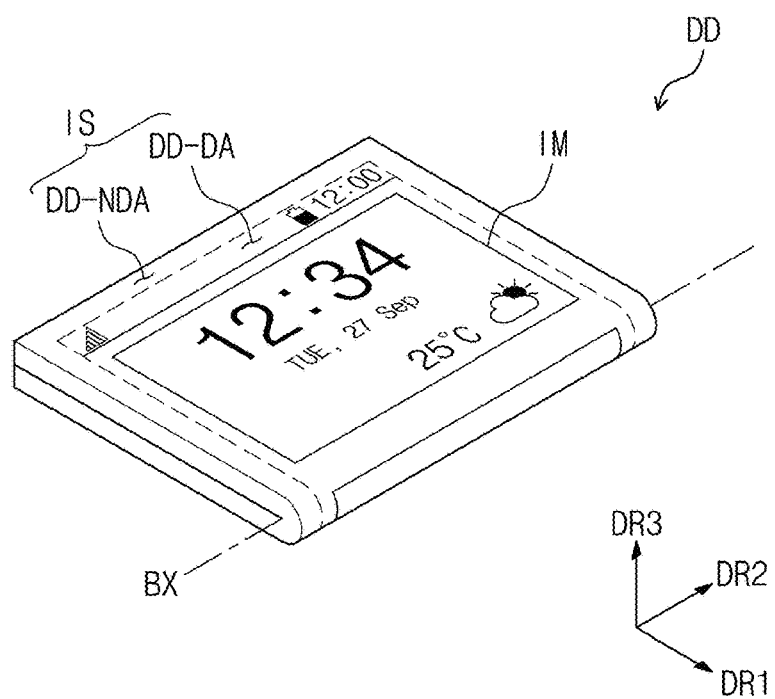

FIGS. 2A and 2B are perspective views, each of which illustrates a folded structure of the display device of FIG. 1.

Referring to FIGS. 1, 2A, and 2B, an embodiment the display device DD may be operated in a first mode or a second mode. When the display device DD is in the first mode, the display device DD may be in a bent or folded state, that is, at least a portion of the display device DD is bent, as shown in FIGS. 2A and 2B. In an embodiment, when the display device DD is in the second mode, the display device DD may be in an unbent or flat state, in which the display device DD is not be bent, as shown in FIG. 1. Referring to FIG. 2A, in the first mode, the display device DD may be configured to be folded inwardly about a bending axis BX. In certain embodiments, referring to FIG. 2B, in the first mode, the display device DD may be configured to be folded outwardly about the bending axis BX.

Figure 3:
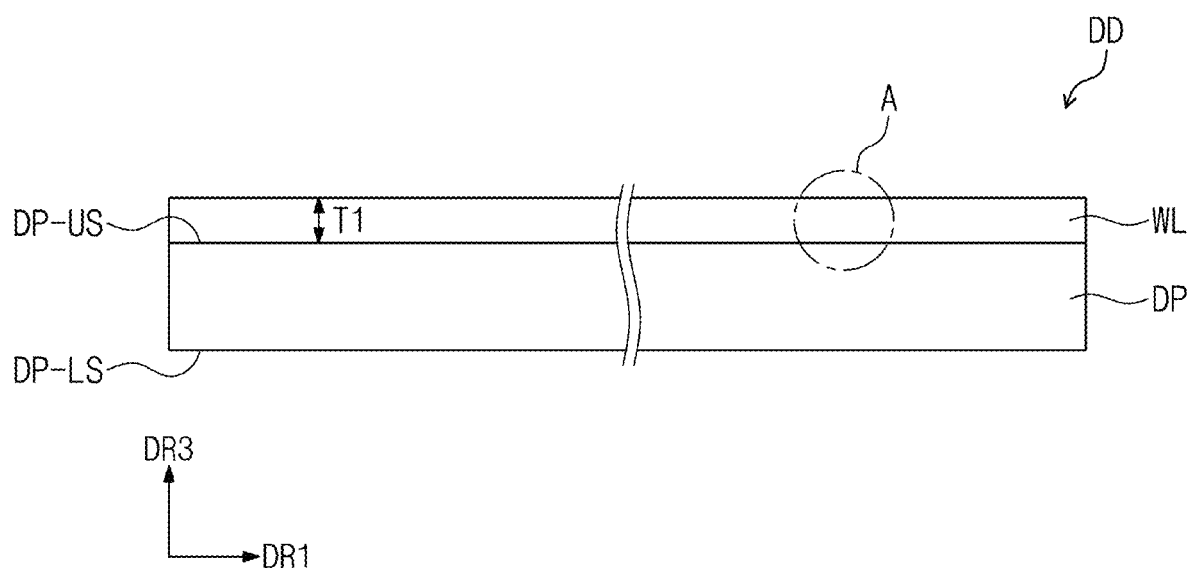
FIG. 3 is a cross-sectional view schematically illustrating a display device according to some embodiments of the disclosure.

FIG. 3 is a cross-sectional view schematically illustrating a display device according to some embodiments of the disclosure.

Referring to FIG. 3, an embodiment of the display device DD may include a display panel DP and a window coating layer WL. The window coating layer WL may be disposed on the display panel DP to directly cover an upper surface DP-US of the display panel DP. In such an embodiment, the window coating layer WL may be in direct contact with the display panel DP, without any adhesion layer therebetween.

In such an embodiment, since any adhesion layer is not provided between the window coating layer WL and the upper surface DP-US of the display panel DP, a squashing effect, which may occur in an adhesion process, and deterioration in resilience characteristics of the flexible display device, which may be caused by creeping of an adhesion layer, may be effectively prevented. In such an embodiment, a process of fabricating a flexible display device may be simple and easy.

A thickness T1 of the window coating layer WL may be in a range from about 50 micromeres (μm) to about 1 millimeter (mm), but the disclosure is not limited thereto. In the case where the window coating layer WL, which is provided to protect the display panel DP, is thinner than about 50 μm, hardness, impact-resistant, and scratch-resistant properties of the window coating layer WL may be too low to effectively protect the display panel DP. In the case where the window coating layer WL functions as a protection layer, a thickness of the window coating layer WL is desired to be greater than a specific thickness, but in the case where the thickness T1 of the window coating layer WL is greater than about 1 mm, there may be an increasing haze issue. When the thickness of the window coating layer WL is too great, it may be difficult to realize a small curvature radius when the display device DD is bent.

In some embodiments, the thickness T1 of the window coating layer WL may be in a range from about 100 μm to about 500 μm (for example, from about 150 μm to about 250 μm). In one embodiment, for example, the thickness T1 of the window coating layer WL may be about 200 μm FIG. 4 is an enlarged cross-sectional view of the encircled portion 'A' of FIG. 3 in an embodiment.

Figure 4:
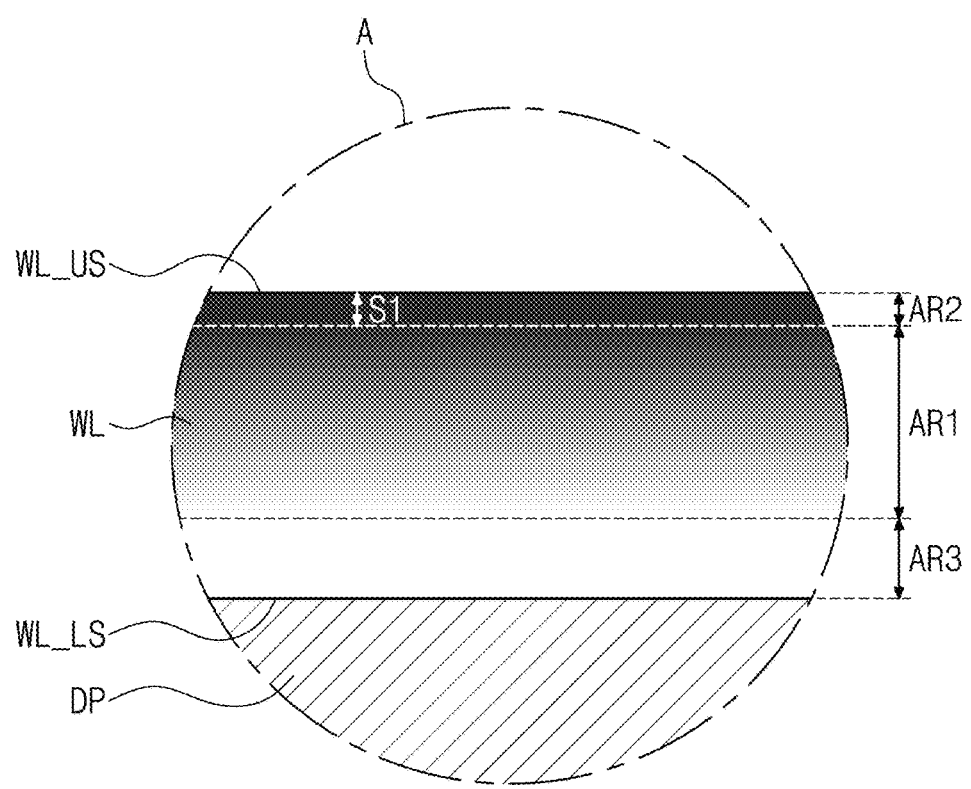
FIG. 4 is an enlarged cross-sectional view of the encircled portion 'A' of FIG. 3 in an embodiment.

Referring to FIG. 4, in an embodiment, the window coating layer WL may include a first region AR1, whose elastic modulus increases in a direction from the display panel DP toward the window coating layer WL. In such an embodiment, the first region AR1 of the window coating layer WL may be provided to have an elastic modulus increasing in a direction from a lower surface WL_LS of the window coating layer WL toward an upper surface WL_US. In such an embodiment, as shown in FIG. 4, the first region AR1 may be a part of the window coating layer WL, but the disclosure is not limited thereto. In one embodiment, for example, the entirety of the window coating layer WL may correspond to the first region AR1.

The upper surface WL_US of the window coating layer WL may define an outer surface of the display device DD, but the disclosure is not limited thereto.

In such an embodiment, the window coating layer WL includes the first region AR1 having the increasing elastic modulus in the direction toward the upper surface WL_US, such that an upper portion of the window coating layer WL may be used to effectively protect the display panel DP, and a lower portion of the window coating layer WL may be used to reduce a difference in elastic modulus from the upper surface DP-US of the display panel DP and thereby to suppress a buckling phenomenon (i.e., delamination between the display panel DP and the window coating layer WL, which may occur when the display device DD is bent).

In such an embodiment, the window coating layer WL may be configured to include two or more kinds of base resins to realize the non-vanishing gradient in elastic modulus of the first region AR1. The "base resin" may mean a resin that is used as a main constituent of the window coating layer WL. In one embodiment, for example, the base resin may be one of thermosetting resin materials, but the disclosure is not limited thereto. In some embodiments, the base resin may include polyurethane, urethane acrylate, polyurea, epoxy, and/or silicone resins. In an embodiment, two or more kinds of base resins may include a same kind of resin, and in such an embodiment, the two or more kinds may have a difference in specific structure (e.g., in a side chain structure). In such an embodiment where two or more kinds of base resins include the same kind of resin, mixing thereof may be easily performed, but the disclosure is not limited thereto.

In some embodiments, the window coating layer WL may include two, three, or four kinds of base resins.

The window coating layer WL may be provided or formed on the upper surface DP-US of the display panel DP by using a coating or printing method. In one embodiment, for example, the window coating layer WL may be formed on the upper surface DP-US of the display panel DP using one of roll coating, silk screen coating, spray coating, and slit coating methods, without providing any adhesion layer between the window coating layer WL and the display panel DP. However, the method of coating the window coating layer WL on the upper surface DP-US of the display panel DP is not limited to the above methods, and various coating methods may be used to directly coat the upper surface DP-US of the display panel DP with the window coating layer WL.

In one embodiment, for example, a method of forming the window coating layer WL on the display panel DP may include coating a base composition, in which two or more kinds of base resins are included, on the upper surface DP-US of the display panel DP and curing the base composition. The base composition may have viscosity in a range from 100 centipoises (cps) to about 10000 cps. In the case where the viscosity of the base composition is less than 100 cps, it may be difficult to control a thickness of a coating layer. By contrast, in the case where the viscosity of the base composition is greater than 1000 cps, it may take a long time to mix two or more kinds of base resins, and thus, such a base composition may be less desired in terms of process efficiency. In some embodiments, the viscosity of the base composition may be in a range from 1000 cps to 5000 cps.

Figure 5:
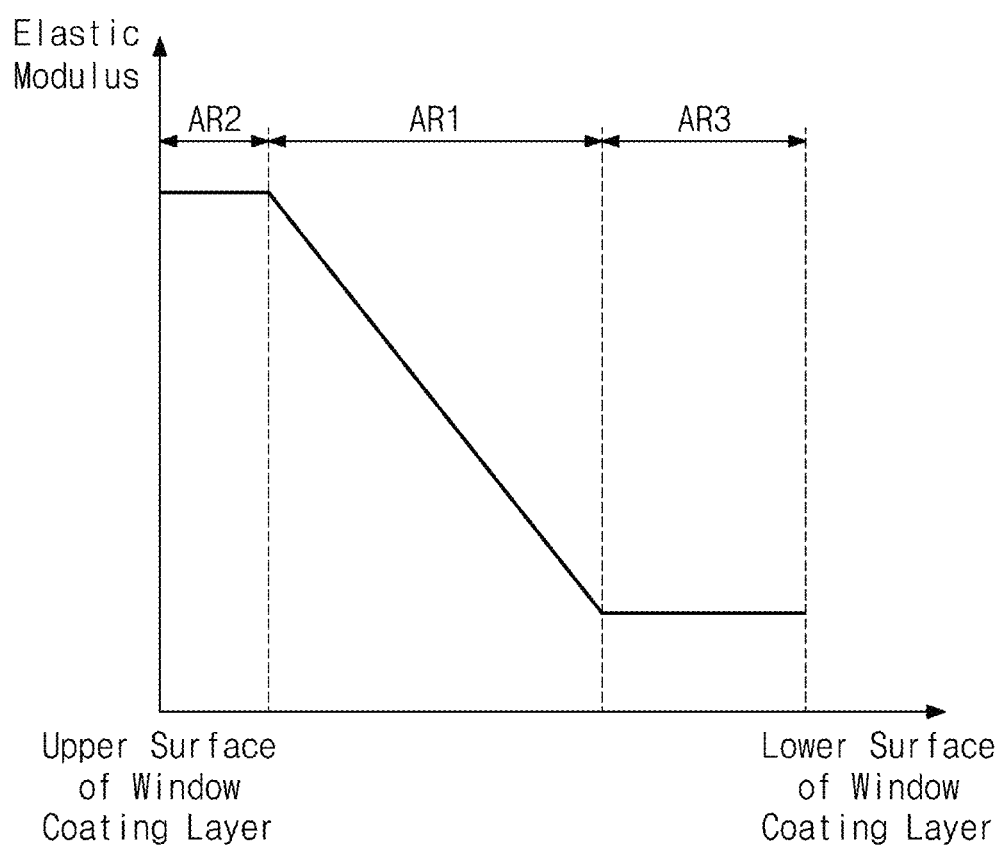
FIG. 5 is a graph showing a regional variation in elastic modulus of a window coating layer, which is included in a display device according to some embodiments of the disclosure.

FIG. 5 is a graph showing a regional variation in elastic modulus of a window coating layer, which is included in a display device according to some embodiments of the disclosure.

Referring to FIGS. 4 and 5, in an embodiment, the window coating layer WL may include a second region AR2 and a third region AR3, which are spaced apart from each other with the first region AR1 interposed therebetween in the third direction DR3. Each of the second region AR2 and the third region AR3 may be configured to have a constant elastic modulus.

The second region AR2 may define the upper surface WL_US of the window coating layer WL, and the third region AR3 may include the lower surface WL_LS of the window coating layer WL. The lower surface WL_LS of the window coating layer WL may be in contact with the upper surface DP-US of the display panel DP (e.g., see FIG. 3).

The second region AR2 defining the upper surface WL_US of the window coating layer WL may be used to protect the display panel DP from an external impact. In such an embodiment, the second region AR2 may be configured to have an elastic modulus higher than that of the third region AR3 including the lower surface WL_LS of the window coating layer WL. In such an embodiment, the window coating layer WL may be configured to allow the second region AR2 to have an elastic modulus higher than that of the third region AR3.

The elastic modulus of the second region AR2 may be in a range from about 1 gigapascal (GPa) to about 10 GPa. In the case where the elastic modulus of the second region AR2 is lower than about 1 GPa, the upper surface WL_US of the window coating layer WL may suffer from a bad scratch-resistant property, and thus, it may be difficult to secure high durability in an upper portion of the window coating layer WL. In the case where the elastic modulus of the second region AR2 is higher than about 10 GPa, it may be difficult to use the window coating layer WL for a flexible display device, even when the window coating layer WL is formed to have a reduced thickness.

In some embodiments, the elastic modulus of the second region AR2 may be in a range from about 1 GPa to about 5 GPa, but the disclosure is not limited thereto.

A thickness S1 of the second region AR2 may be in a range from about 5 µm to about 10 µm. In the case where the thickness S1 of the second region AR2 having a relatively high elastic modulus is within the above range, the window coating layer WL may be effectively used as a protection layer. The thickness S1 of the second region AR2 may be, for example, about 7 µm.

The elastic modulus of the third region AR3 may be in a range from about 1 megapascal (MPa) to about 100 MPa. In the case where the elastic modulus of the third region AR3 is lower than about 1 MPa, the third region AR3 may be excessively soft and the durability thereof may be too low. If the elastic modulus of the third region AR3 is higher than about 100 MPa, a delamination problem may occur between the upper surface DP-US of the display panel DP and the lower surface WL_LS of the window coating layer WL, due to a difference in elastic modulus therebetween, during a step of bending the display device DD.

The window coating layer WL may have a single-layer structure. Even if the window coating layer WL has a single-layer structure, the window coating layer WL may be configured to include a region having a non-vanishing elastic modulus gradient.

Although, for convenience of illustration, the variation in elastic modulus of the first region AR1 in FIG. 5 is illustrated by a straight line, the disclosure is not limited thereto. In one embodiment, for example, the elastic modulus of the first region AR1 may be non-linearly increases in the direction from the display panel DP toward the window coating layer WL, such that the first region AR1 may be a region, whose elastic modulus is illustrated in a curved line.

In an embodiment, where the display panel DP includes the two or more kinds of base resins as described above, the window coating layer WL may further selectively include an additive agent. In one embodiment, for example, the window coating layer WL may further include an ultraviolet absorber of preventing the display panel from being deteriorated by ultraviolet light. The ultraviolet absorber may be one of ultraviolet absorbers known in the art. In one embodiment, for example, the window coating layer WL may include at least one of benzophenone, oxanilide, benzotriazole, and triazine ultraviolet absorbers. The ultraviolet absorber may be contained in an amount of about 1 weight percent (wt %) or less, with respect to the total weight of the window coating layer WL.

Figure 6:
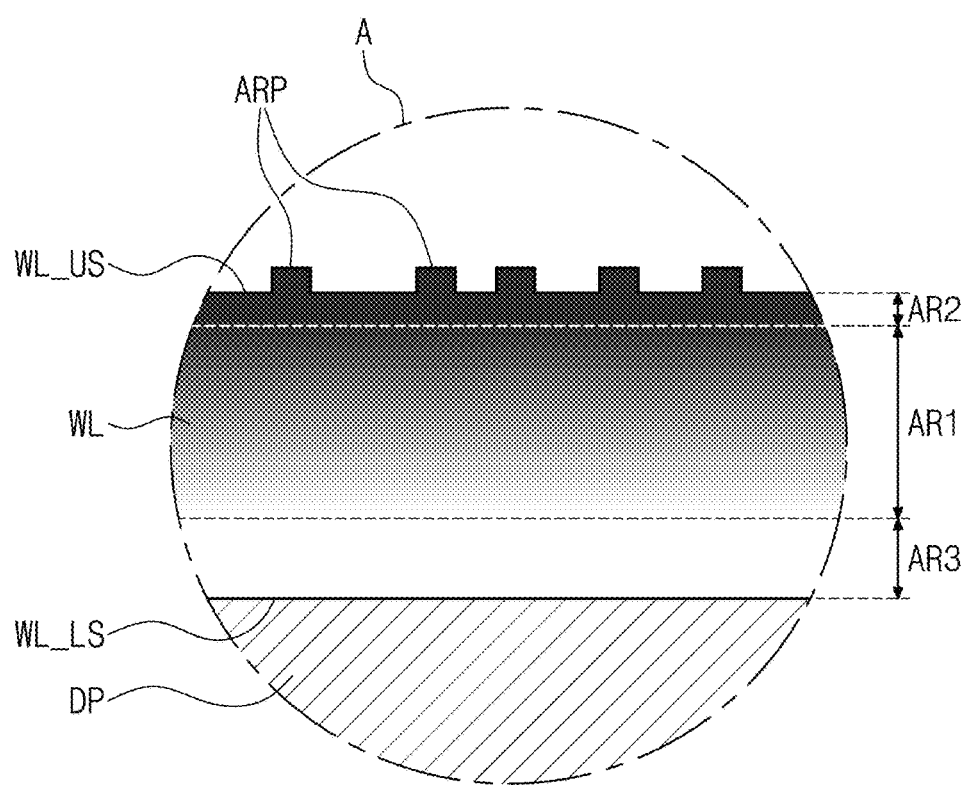
FIG. 6 is an enlarged cross-sectional view of the encircled portion 'A' of FIG. 3 in an alternative embodiment.

FIG. 6 is an enlarged cross-sectional view of the encircled portion 'A' of FIG. 3 in an alternative embodiment.

Referring to FIG. 6, in an embodiment, the upper surface WL_US of the window coating layer WL may include irregular bumpy patterns ARP. The irregular bumpy patterns ARP may serve as an anti-reflection pattern. In an embodiment, tach of the irregular bumpy patterns ARP may be formed to have a width of several hundred nanometers and a height of several to several hundred nanometers. In such an embodiment, an unintended change in mechanical characteristics of the window coating layer WL may be effectively prevented. In some embodiments, the width of each of the irregular bumpy patterns ARP may be in a range from about 100 nanometers (nm) to 300 (nm), but the disclosure is not limited thereto. In some embodiment, the height of each of the irregular bumpy patterns ARP may be in a range from 10 nm to 200 nm, but the disclosure is not limited thereto.

In some embodiments, the irregular bumpy patterns ARP may be formed by one of several methods known in the art (for example, by performing a plasma treatment process on the upper surface WL_US of the window coating layer WL).

Figure 7:
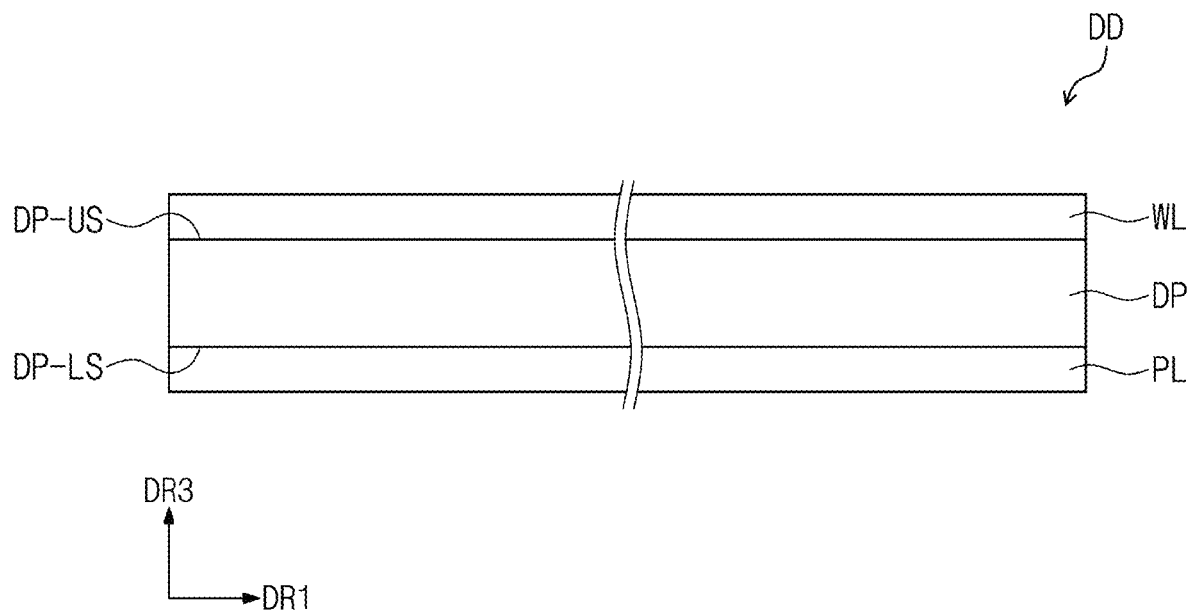
FIG. 7 is a cross-sectional view schematically illustrating a display device according to some embodiments of the disclosure.

FIG. 7 is a cross-sectional view schematically illustrating a display device according to some embodiments of the disclosure.

Referring to FIG. 7, the display device DD may further include a base coating layer PL, which is disposed directly on a lower surface DP-LS of the display panel DP. In one embodiment, for example, the base coating layer PL may be directly provided or formed on the lower surface DP-LS of the display panel DP, without providing any adhesion layer interposed therebetween. The lower surface of the base coating layer PL may be exposed to the outside.

The base coating layer PL may be formed by a coating or printing method. In one embodiment, for example, the base coating layer PL may be formed on the lower surface DP-LS of the display panel DP by one of roll-coating, silk-screen coating, spray coating, and slit coating methods. However, the method of coating the lower surface DP-LS of the display panel DP with the base coating layer PL is not limited to the above methods.

In such an embodiment, where the window coating layer WL is directly provided on the upper surface DP-US of the display panel DP, without any adhesion layer interposed therebetween, a thickness of a display device may be reduced. In such an embodiment, as described above, the base coating layer PL is provided directly on the lower surface DP-LS of the display panel DP, such that the thickness of the display device may be reduced by a thickness of an adhesion layer conventionally provided. In such an embodiment, the base coating layer PL may be used to protect the display panel DP and improve convenience in a subsequent process.

FIGS. 8A to 8D are cross-sectional views schematically illustrating display devices according to some embodiments of the disclosure.

Figure 8A:
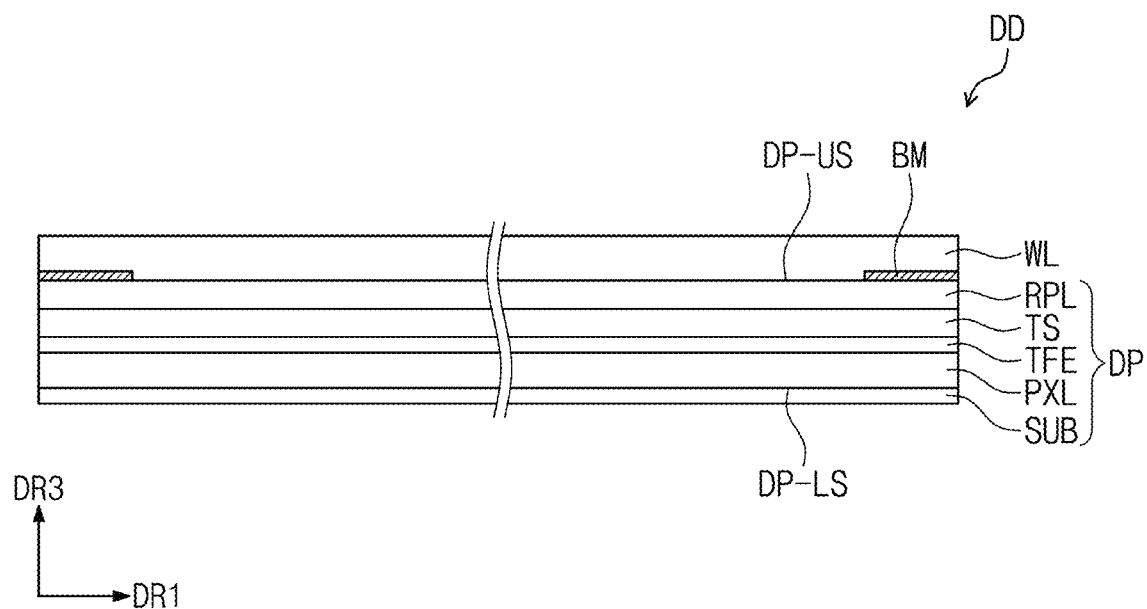
FIGS. 8A to 8D are cross-sectional views schematically illustrating display devices according to some embodiments of the disclosure.

Referring to FIG. 8A, an embodiment of the display panel DP may include a base layer SUB, a pixel layer PXL, an input-sensing layer TS, and an anti-reflection layer RPL, but the disclosure is not limited thereto. In one embodiment, for example, the display panel DP may be configured to further include at least one (e.g., an encapsulation layer TFE) of components known in the art.

In an embodiment, the base layer SUB, the pixel layer PXL, the input-sensing layer TS, the anti-reflection layer RPL and the encapsulation layer TFE may be formed by a series of successive processes, but the disclosure is not limited thereto. In an embodiment, the input-sensing layer TS, the anti-reflection layer RPL, and the encapsulation layer TFE may be provided on an upper surface of the pixel layer PXL, without providing any adhesion layer therebetween. In such an embodiment, a squashing effect, which may occur in an adhesion process, and deterioration in resilience characteristics of the flexible display device, which may be caused by creeping of an adhesion layer, may be effectively prevented, and a process of fabricating a flexible display device may become simple and easy.

The base layer SUB may be a substrate, on which the pixel layer PXL, the input-sensing layer TS, the anti-reflection layer RPL and the encapsulation layer TFE are disposed. The base layer SUB may be configured to prevent external moisture from infiltrating into the pixel layer PXL and to absorb an external impact or shock. The base layer SUB may be a flexible substrate. The base layer SUB may include one selected from polyethersulfone ("PES"), polyacrylate ("PAR"), polyetherimide ("PEI"), polyethylenenapthalate ("PEN"), polyethyleneterephtalate ("PET"), polyphenylenesulfide ("PPS"), polyarylate, polyimide ("PI"), polycarbonate ("PC"), poly(aryleneether sulfone), and a combination thereof.

The material for the base layer SUB is not limited to the afore-described plastic resins. In one embodiment, for example, the base layer SUB may be or include a glass substrate, a metal substrate, or a substrate made of an organic/inorganic composite material.

The pixel layer PXL may be disposed on the base layer SUB. The pixel layer PXL may be configured to display an image, in response to image data (not shown) provided thereto.

The pixel layer PXL may be an organic light emitting display panel, an electrophoresis display panel, or an electrowetting display panel, but the disclosure is not limited to a specific kind of the pixel layer PXL. The description that follows will refer some embodiments, in which the pixel layer PXL is the organic light emitting display panel. The detailed structure of the organic light emitting display panel will be described in greater detail below.

In an embodiment, the encapsulation layer TFE may be provided on the pixel layer PXL. The encapsulation layer TFE may hermetically seal the pixel layer PXL. The encapsulation layer TFE may protect the pixel layer PXL from external moisture or oxygen. The encapsulation layer TFE may be formed of or include an organic material. In certain embodiments, the encapsulation layer TFE may have a structure, in which organic and inorganic layers are stacked.

The input-sensing layer TS and the anti-reflection layer RPL may be disposed on the encapsulation layer TFE, without being limited to a specific stacking order. In one embodiment, for example, the anti-reflection layer RPL may be disposed between the encapsulation layer TFE and the input-sensing layer TS, and the input-sensing layer TS may be provided between the encapsulation layer TFE and the anti-reflection layer RPL.

The input-sensing layer TS may be configured to obtain coordinate information on an external input. The external input may be a direct touch event or an indirect touch event. The input-sensing layer TS may be disposed on the upper surface of the encapsulation layer TFE. The input-sensing layer TS, pixel layer PXL and the encapsulation layer TFE may be formed by a series of successive processes. The input-sensing layer TS may be disposed directly on the upper surface of the encapsulation layer TFE, but the disclosure is not limited thereto. In one embodiment, for example, an adhesion layer may be interposed between the input-sensing layer TS and the encapsulation layer TFE.

The anti-reflection layer RPL may be disposed on the upper surface of the input-sensing layer TS. The anti-reflection layer RPL may define the outermost region of the display panel DP.

The anti-reflection layer RPL may reduce reflectance of light incident from the outside. In one embodiment, for example, to reduce the reflectance of the incident light, the anti-reflection layer RPL may include a polarization plate, which is used to change polarization of the incident light, a phase-retardation film, which is used to cause destructive interference of the incident light, and a plurality of color filter layers and a light absorbing element (e.g., a black matrix), which are used to absorb the incident light.

In some embodiments, the anti-reflection layer RPL, and the input-sensing layer TS may be formed by a series of successive processes. In some embodiments, the anti-reflection layer RPL may define a part of the input-sensing layer TS.

A black matrix BM may be disposed on the upper surface DP-US of the display panel DP and may overlap with the non-display region DD-NDA (e.g., see FIG. 1). The black matrix BM may be formed of or include at least one of materials capable of absorbing light incident thereto. In general, the black matrix BM may include a black organic material or chromium oxide (CrOx), in which black pigment is contained. Since the black matrix BM is overlapped with the non-display region DD-NDA, it may be possible to effectively prevent interconnection lines, which are used to operate the display device DD, from being recognized by a user, and to absorb external light (i.e., to reduce reflection of the external light). In one embodiment, for example, the black matrix BM may be disposed to overlap with the entirety of the non-display region DD-NDA of FIG. 1, when viewed in a plan view.

As shown in FIG. 8A, the window coating layer WL may be disposed directly on an outer surface of the anti-reflection layer RPL and an outer surface of the black matrix BM. In one embodiment, for example, the window coating layer WL may be provided to be in direct contact with the upper surface of the anti-reflection layer RPL and the upper surface of the black matrix BM. In such an embodiment, the upper surface of the anti-reflection layer RPL and the upper surface of the black matrix BM may serve as the upper surface DP-US of the display panel DP. As described above, the window coating layer WL may be provided directly on the upper surface of the anti-reflection layer RPL and the upper surface of the black matrix BM, without an adhesion layer (e.g., an optical clear adhesive ("OCA"), an optical clear resin ("OCR"), a pressure sensitive adhesive ("PSA")) therebetween.

Figure 8B:
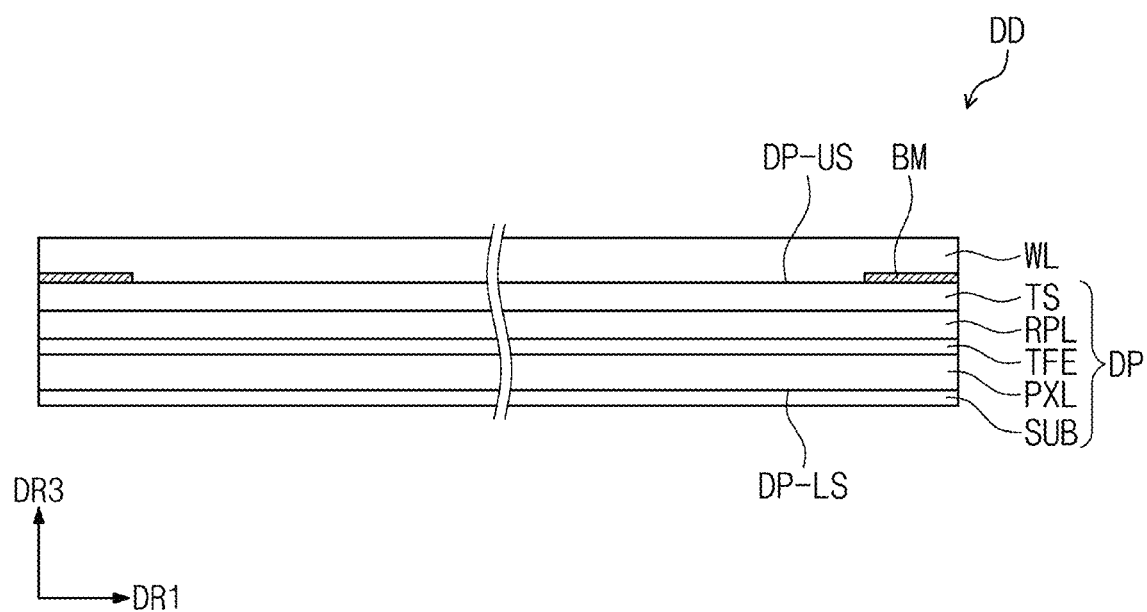
Figure 8C:
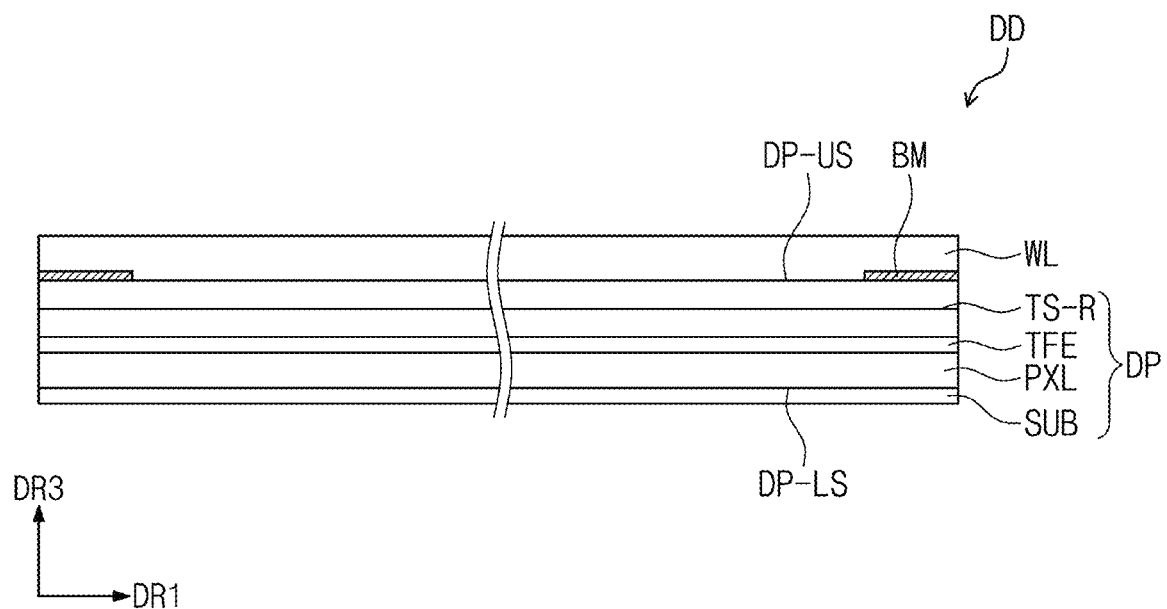
Figure 8D:
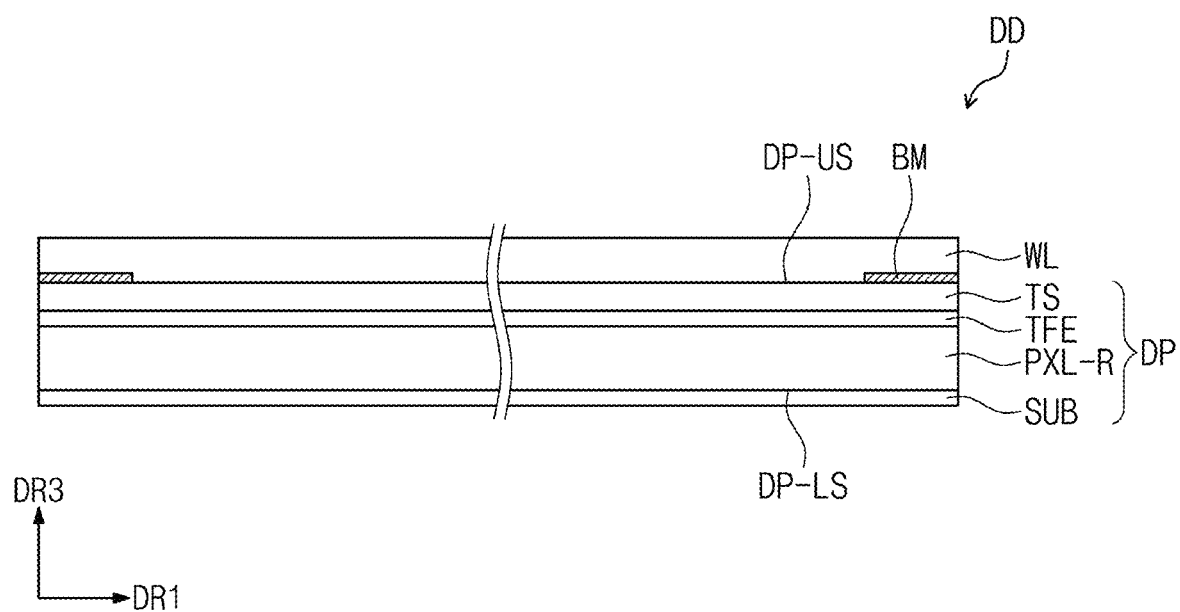

In an alternative embodiment, as shown in FIGS. 8B to 8D, the stacking structure of layers constituting the display panel DP may be variously changed.

Referring to FIG. 8B, in an alternative embodiment, the anti-reflection layer RPL of the display panel DP may be disposed on the upper surface of the encapsulation layer TFE, and the input-sensing layer TS may be disposed on the upper surface of the anti-reflection layer RPL. In such an embodiment, the input-sensing layer TS may define the outermost layer of the display panel DP, and the upper surface DP-US of the display panel DP may be an outer surface of the input-sensing layer TS (i.e., the upper surface of the input-sensing layer TS), and the window coating layer WL may be disposed directly on the upper surface of the input-sensing layer TS.

Referring to FIG. 8C, in another alternative embodiment, the anti-reflection layer RPL may be integrated in an input-sensing layer TS-R (e.g., in FIG. 2A). In such an embodiment, the anti-reflection layer RPL may define a part of the input-sensing layer TS-R. In such an embodiment, the input-sensing layer TS-R may define the outermost layer of the display panel DP, the upper surface DP-US of the display panel DP may be an outer surface of the input-sensing layer TS-R (i.e., the upper surface of the input-sensing layer TS-R), and the window coating layer WL may be disposed directly on the upper surface of the input-sensing layer TS-R.

Referring to FIG. 8D, in another alternative embodiment, the anti-reflection layer RPL (e.g., in FIG. 2A) may be integrated in a pixel layer PXL-R. In such an embodiment, the anti-reflection layer RPL may defines a part of the pixel layer PXL-R. In such an embodiment, the input-sensing layer TS may define the outermost layer of the display panel DP, the upper surface DP-US of the display panel DP may be an outer surface of the input-sensing layer TS (i.e., the upper surface of the input-sensing layer TS), and the window coating layer WL may be disposed directly on the upper surface of the input-sensing layer TS.

Some stacking structures of layers constituting the display panel DP have been described above, but the disclosure is not limited thereto. In such an embodiment, the stacking order or structure of the layers constituting the display panel DP may be variously changed.

Figure 9:
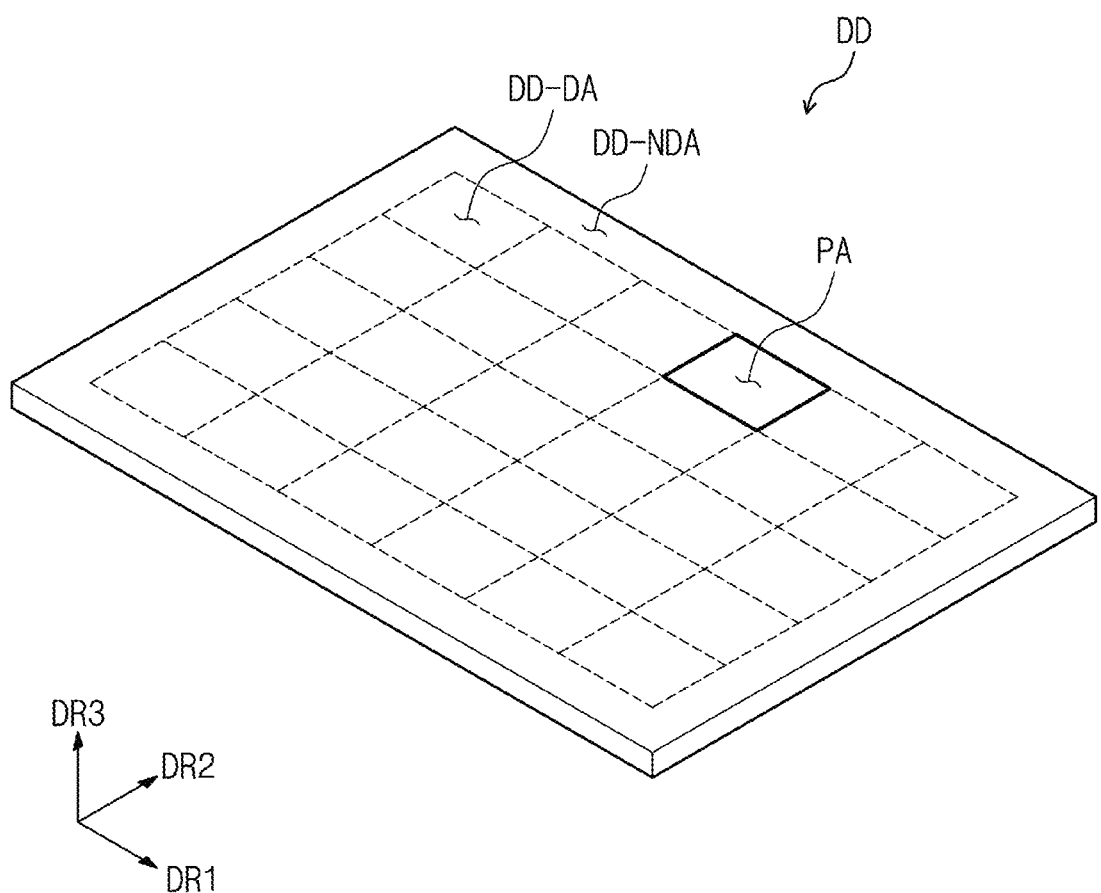
FIG. 9 is a perspective view illustrating a display device according to some embodiments of the disclosure.
Figure 10:
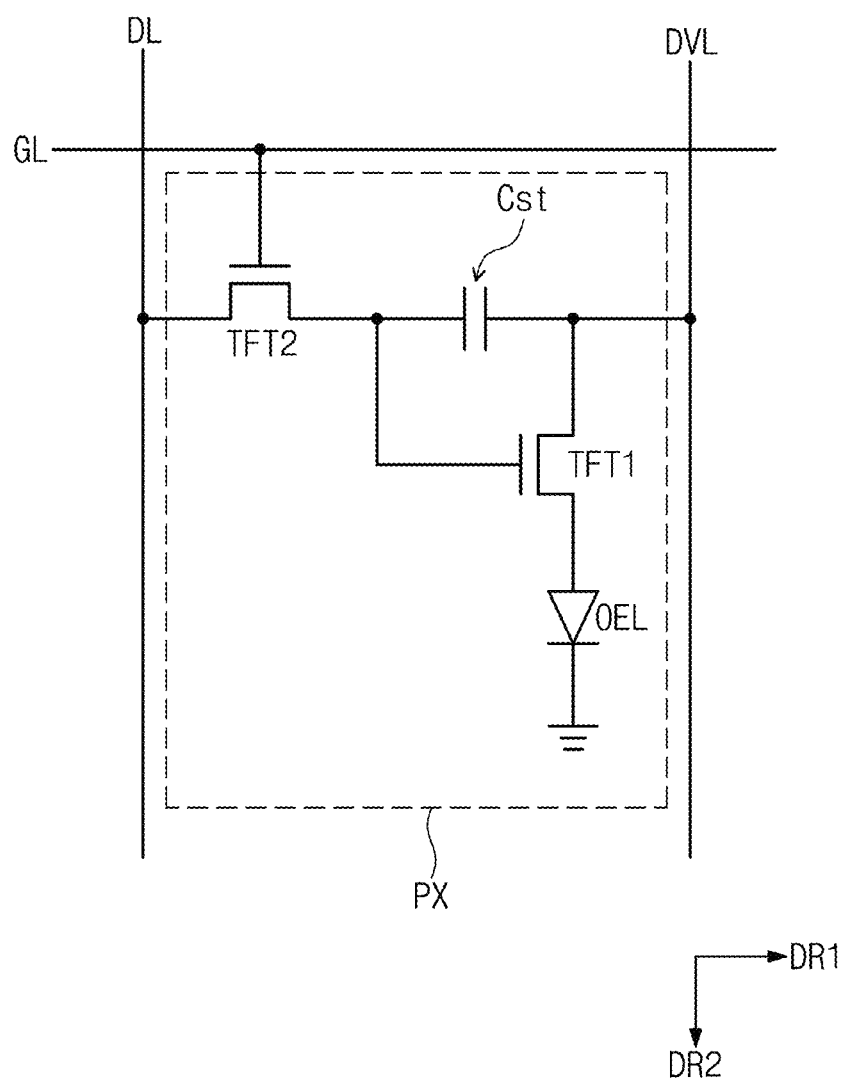
FIG. 10 is a circuit diagram of one of pixels, which are included in a display device according to some embodiments of the disclosure.
Figure 11:
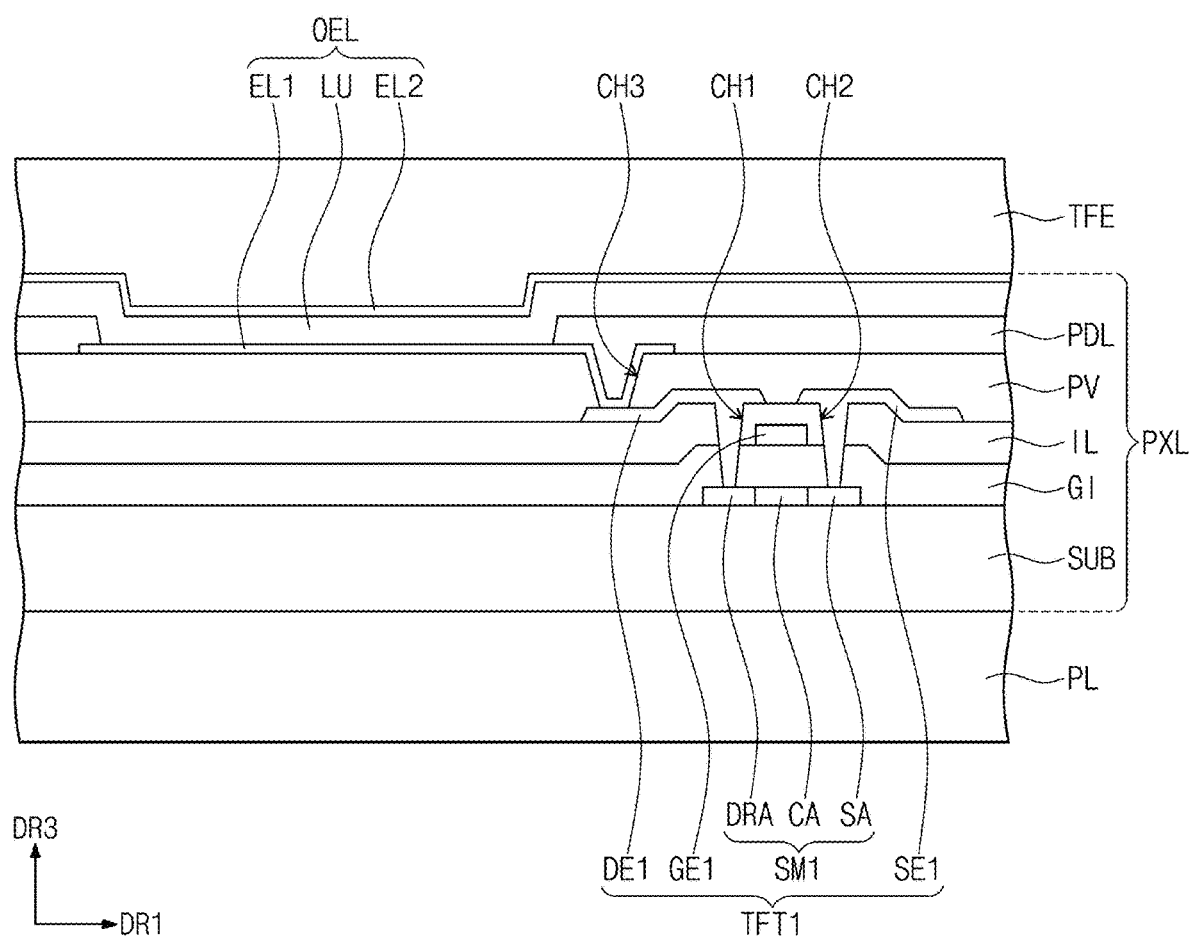
FIG. 11 is a cross-sectional view schematically illustrating a portion of a pixel whose circuit diagram is given by FIG. 10.

FIG. 9 is a perspective view illustrating a display device according to some embodiments of the disclosure. FIG. 10 is a circuit diagram of one of pixels, which are included in a display device according to some embodiments of the disclosure. FIG. 11 is a cross-sectional view schematically illustrating a portion of a pixel whose circuit diagram is given by FIG. 10.

Hereinafter, an embodiment, in which the display device is an organic electroluminescent device, will be described in detail with reference to FIGS. 9 to 11. That is, the description that follows will refer to an exemplary embodiment, in which the pixel layer PXL includes an organic electroluminescent device OEL, but the disclosure is not limited thereto.

Referring to FIG. 9, an embodiment of the display device DD may include the display region DD-DA and the non-display region DD-NDA, as described above. The display region DD-DA may include a plurality of pixel regions PA. The pixel regions PA may be arranged in a matrix form. A plurality of pixels PX may be provided in the pixel regions PA. Each of the pixels PX may include an organic electroluminescent device (e.g., see OEL of FIG. 10).

Referring to FIG. 10, each of the pixels PX may be connected to an interconnection structure including a gate line GL, a data line DL, and a driving voltage line DVL. Each of the pixels PX may include thin-film transistors TFT1 and TFT2, which are connected to the interconnection structure, and an organic electroluminescent device OEL and a capacitor Cst, which are connected to the thin-film transistors TFT1 and TFT2.

The gate line GL may extend in the first direction DR1. The data line DL may extend in the second direction DR2 to cross the gate line GL. The driving voltage line DVL may extend in substantially the same direction as the data line DL (i.e., in the second direction DR2). The gate line GL may transmit scan signals to the thin-film transistors TFT1 and TFT2, the data line DL may transmit data signals to the thin-film transistors TFT1 and TFT2, and the driving voltage line DVL may apply a driving voltage to the thin-film transistors TFT1 and TFT2.

The thin-film transistors TFT1 and TFT2 may include a driving thin-film transistor TFT1 for controlling the organic electroluminescent device OEL and a switching thin-film transistor TFT2 for controlling a switching operation of the driving thin-film transistor TFT1. As described above, each of the pixels PX may include two thin-film transistors TFT1 and TFT2, but the disclosure is not limited thereto. In one embodiment, for example, each of the pixels PX may include a single thin-film transistor and a single capacitor. In certain embodiments, each of the pixels PX may include three or more thin-film transistors and two or more capacitors.

In detail, FIG. 11 is a cross-sectional view schematically illustrating a portion, in which the driving thin-film transistor TFT1 and the organic electroluminescent device OEL of FIG. 10 are provided.

Referring to FIGS. 10 and 11, the driving thin-film transistor TFT1 may include a first gate electrode GE1, a first source electrode SE1, and a first drain electrode DE1. The first gate electrode GE1 may be connected to a first common electrode (not shown). The first source electrode SE1 may be connected to the driving voltage line DVL. The first drain electrode DE1 may be connected to a first electrode EL1 through a third contact hole CH3 through a passivation layer PV disposed thereon.

The capacitor Cst may be connected between the first gate electrode GE1 and the first source electrode SE1 of the driving thin-film transistor TFT1 and may be used to maintain a voltage level of a data signal to be input to the first gate electrode GE1 of the driving thin-film transistor TFT1.

The driving thin-film transistor TFT1 and the organic electroluminescent device OEL may be disposed on the base layer SUB. A substrate buffer layer (not shown) may be disposed on the base layer SUB. The substrate buffer layer may effectively prevent impurities from being diffused into the driving thin-film transistor TFT1 and the switching thin-film transistor TFT2. The substrate buffer layer may be formed of or include silicon nitride (SiNx), silicon oxide (SiOx), or silicon oxynitride (SiOxNy). In an alternative embodiment, the substrate buffer layer may be omitted, depending on the material or process condition for the base layer SUB.

A first semiconductor layer SM1 may be disposed on the base layer SUB. Although not shown in detail, the first semiconductor layer SM1 may be formed of a semiconductor material and may function as an active layer of the driving thin-film transistor TFT1. The first semiconductor layer SM1 may include a source region SA, a drain region DRA, and a channel region CA between the source and drain regions SA and DRA. The first semiconductor layer SM1 may be formed of or include at least one of inorganic or organic semiconductor materials. The source region SA and the drain region DRA may be doped with n-type or p-type impurities.

A gate insulating layer GI may be disposed on the first semiconductor layer SM1. The gate insulating layer GI may be disposed to cover the first semiconductor layer SM1. The gate insulating layer GI may be formed of or include an organic or inorganic insulating material.

The first gate electrode GE1 may be disposed on the gate insulating layer GI. The first gate electrode GE1 may be disposed to cover a region of the gate insulating layer GI corresponding to the channel region CA of the first semiconductor layer SM1.

An interlayered insulating layer IL may be disposed on a second gate electrode GE2. The interlayered insulating layer IL may be disposed to cover the first gate electrode GE1. The interlayered insulating layer IL may be formed of or include at least one of organic or inorganic insulating materials.

The first source electrode SE1 and the first drain electrode DE1 may be disposed on the interlayered insulating layer IL. The first drain electrode DE1 may be in contact with the drain region DRA of the first semiconductor layer SM1 through a first contact hole CH1, which is defined in the gate insulating layer GI and the interlayered insulating layer IL, and the first source electrode SE1 may be in contact with the source region SA of the first semiconductor layer SM1 through a second contact hole CH2, which is defined in the gate insulating layer GI and the interlayered insulating layer IL.

The passivation layer PV may be disposed on the first source electrode SE1 and the first drain electrode DE1. The passivation layer PV may serve as a protection layer for protecting the driving thin-film transistor TFT1 and may serve as a planarization layer providing a flat top surface.

The organic electroluminescent device OEL may be disposed on the passivation layer PV. The organic electroluminescent device OEL may include the first electrode EL1, a second electrode EL2 disposed on the first electrode EL1, and a luminescent unit LU disposed between the first electrode EL1 and the second electrode EL2.

In one embodiment, for example, the first electrode EL1 may be disposed on the passivation layer PV, and a pixel defining layer PDL may be provided on the passivation layer PV and the first electrode EL1. In such an embodiment, a portion of the upper surface of the first electrode EL1 is exposed through the pixel defining layer PDL. The pixel defining layer PDL may be formed of or include a metal-fluorine compound, but the disclosure is not limited thereto.

The luminescent unit LU and the second electrode EL2 may be sequentially disposed on the pixel defining layer PDL and the first electrode EL1. The first electrode EL1 may serve as, for example, a positive terminal. The first electrode EL1 may be connected to the first drain electrode DE1 of the driving thin-film transistor TFT1 through the third contact hole CH3, which is defined in the passivation layer PV.

The first electrode EL1 may be conductive. The first electrode EL1 may be a pixel electrode or a positive terminal. The first electrode EL1 may be a transparent electrode, a semitransparent electrode, or a reflective electrode. In an embodiment where the first electrode EL1 is the transparent electrode, the first electrode EL1 may be formed of or include a transparent metal oxide (e.g., indium tin oxide ("ITO"), indium zinc oxide ("IZO"), zinc oxide (ZnO), or indium tin zinc oxide ("ITZO")). In an embodiment where the first electrode EL1 is the semitransparent or reflective electrode, the first electrode EL1 may be formed of or include at least one of metallic materials (e.g., including Ag, Mg, Al, Pt, Pd, Au, Ni, Nd, Ir, and Cr).

The second electrode EL2 may be a common electrode or a negative terminal. The second electrode EL2 may be a transparent electrode, a semitransparent electrode, or a reflective electrode.

In an embodiment the second electrode EL2 is the transparent electrode, the second electrode EL2 may be formed of or include at least one of Li, Ca, LiF/Ca, LiF/Al, Al, Mg, BaF, Ba, Ag, compounds thereof, or mixtures thereof (e.g., a mixture of Ag and Mg), but the disclosure is not limited thereto. The second electrode EL2 may be formed of or include, for example, ITO, IZO, zinc oxide (ZnO), or ITZO.

Although not shown, the second electrode EL2 may be connected to an auxiliary electrode. The auxiliary electrode may include or be formed of at least one of various conductive materials. In one embodiment, for example, the auxiliary electrode may be formed of or include at least one of Li, Ca, LiF/Ca, LiF/Al, Al, Mg, BaF, Ba, Ag, compounds thereof, or mixtures thereof (e.g., a mixture of Ag and Mg), but the disclosure is not limited thereto. The auxiliary electrode may be formed of or include, for example, ITO, IZO, zinc oxide (ZnO), or ITZO. In some embodiments, the auxiliary electrode may be connected to the second electrode EL2 and may be used to decrease electric resistance of the second electrode EL2.

In an embodiment where the second electrode EL2 is the semitransparent or reflective electrode, the second electrode EL2 may be formed of or include at least one of Ag, Mg, Al, Pt, Pd, Au, Ni, Nd, Ir, Cr, Li, Ca, LiF/Ca, LiF/Al, Mo, Ti, compounds thereof, or mixtures thereof (e.g., a mixture of Ag and Mg). In certain embodiments, the second electrode EL2 may be provided to have a multi-layered structure including a reflective or semi-transparent layer (e.g., of the above material) and a transparent conductive layer (e.g., ITO, IZO, zinc oxide (ZnO), or ITZO).

The luminescent unit LU disposed between the first electrode EL1 and the second electrode EL2 may be an organic layer. The luminescent unit LU may include a hole transport region on the first electrode ELL a luminescent layer on the hole transport region, and an electron transport region on the luminescent layer. In such an embodiment, the hole transport region, the luminescent layer, and the electron transport region may be variously configured based on a conventional structure known in the art.

The hole transport region may have a single-layered structure including different materials. In certain embodiments, the hole transport region may have one of multi-layered structures of hole injection layer/hole transport layer, hole injection layer/hole transport layer/hole buffer layer, hole injection layer/hole buffer layer, hole transport layer/hole buffer layer, or hole injection layer/hole transport layer/electron blocking layer, which are sequentially stacked on the first electrode ELL but the disclosure is not limited thereto.

The luminescent layer may be or include a single layer, which includes a single material or a plurality of different materials. In certain embodiments, the luminescent layer may have a multi-layered structure including a plurality of layers that includes different materials, respectively. The luminescent layer may include hosts and dopants.

The electron transport region may include at least one of a hole blocking layer, an electron transport layer, or an electron injection layer, but the disclosure is not limited thereto.

The encapsulation layer TFE may be disposed on the second electrode EL2. In one embodiment, for example, the encapsulation layer TFE may be disposed to be in direct contact with the upper surface of the second electrode EL2.

Figure 12:
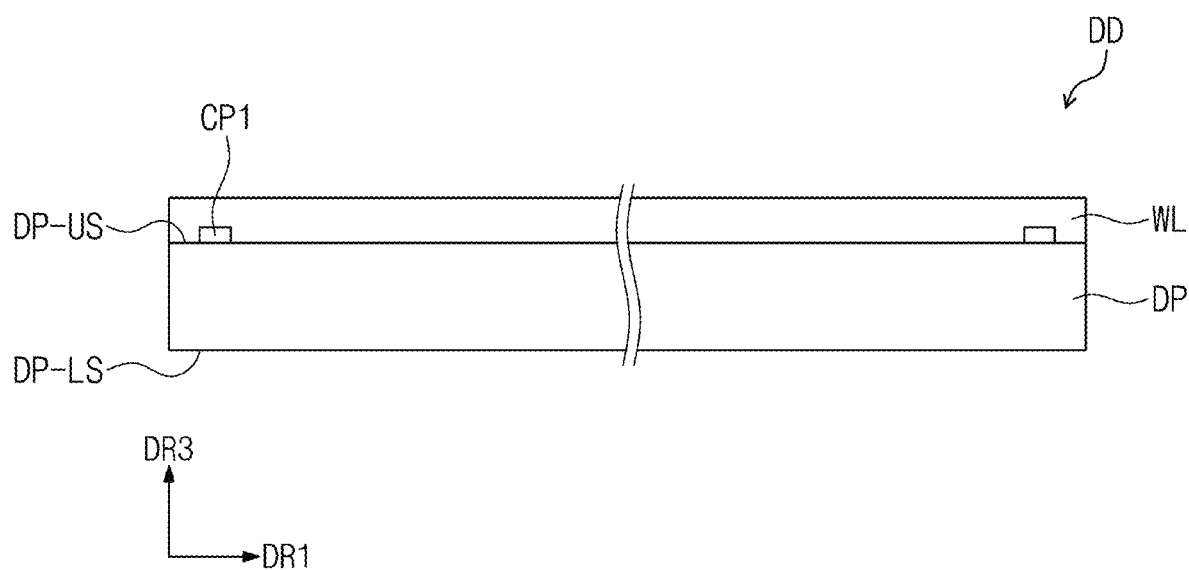
FIG. 12 is a cross-sectional view schematically illustrating a display device according to some embodiments of the disclosure.

FIG. 12 is a cross-sectional view schematically illustrating a display device according to some embodiments of the disclosure.

Referring to FIGS. 1 and 12, an embodiment of the display device DD may further include a first curl prevention pattern CP1. The first curl prevention pattern CP1 may be disposed on the upper surface DP-US of the display panel DP. The first curl prevention pattern CP1 may be covered with the window coating layer WL. In such an embodiment where the first curl prevention pattern CP1 is provided in the display device DD, a delamination or curl phenomenon, which may be caused by the curing shrinkage of the window coating layer WL or by a difference in thermal expansion coefficient between layers of the window coating layer WL, may be effectively prevented during the process of forming the window coating layer WL The display region DD-DA may include a luminescent region and a non-luminescent region. In an embodiment, the first curl prevention pattern CP1 may overlap with the non-luminescent region. The first curl prevention pattern CP1 may be formed by a deposition or screen printing method. The first curl prevention pattern CP1 may have an elastic modulus higher than that of the third region AR3 (e.g., of FIG. 4) of the window coating layer WL.

In an embodiment where, although not shown, the display device DD includes the base coating layer PL (e.g., of FIG. 7) which is disposed directly on the lower surface DP-LS of the display panel DP, the display device DD may further include a second curl prevention pattern provided on the lower surface DP-LS of the display panel DP. The second curl prevention pattern may be covered with the base coating layer PL of FIG. 7.

In an alternative embodiment, the display device DD may further selectively include an additional element. Although not shown, the display panel DP may include a barrier layer, which is formed of or includes at least one of inorganic materials (e.g., silicon nitride (SiNx), silicon oxide (SiOx), silicon oxynitride (SiOxNy), lithium fluoride (LiF)) or organic materials and is used as the uppermost layer thereof, to effectively prevent various technical issues (e.g., impurity infiltration, deterioration in coating property, and process damage), which may occur when the window coating layer WL is formed. In such an embodiment, an upper surface of the barrier layer may serve as the upper surface DP-US of the display panel DP.

According to some embodiments of the disclosure, a display device may include a window coating layer disposed directly on an upper surface of a display panel, and a portion of the window coating layer may have an elastic modulus increasing in an upward direction. In a conventional display device where the window coating layer is disposed directly on the upper surface of the display panel without any adhesion layer, the window coating layer may be desired for a bending process, due to its relatively low elastic modulus, but it may suffer from low durability. Thus, a method of providing a hard coating layer on an upper surface of the window coating layer has been proposed to improve durability, but it may suffer from other problems (e.g., surface deformation or delamination phenomenon), which may be caused by an abrupt change in material characteristics (e.g., in elastic modulus) between the window coating layer and the hard coating layer. In embodiments of the display device the invention, the window coating layer may be configured to have relatively low elastic modulus at a region adjacent to the display panel and relatively high elastic modulus at a region apart from the display panel. In such embodiments, the window coating layer may be configured to have a non-vanishing elastic modulus gradient, such that both of high flexibility and high durability are achieved. In such embodiments, the window coating layer may have a single-layer structure with a varying elastic modulus property, not a multi-layered structure including a plurality of different layers with different elastic moduli, such that an interlayer delamination problem, which may be caused by the abrupt change in elastic modulus, is effectively prevented.

According to some embodiments of the disclosure, a display device may include a window coating layer, which is disposed directly on an upper surface of a display panel without any adhesion layer. The window coating layer may include a region having a non-vanishing elastic modulus gradient such that high durability is realized and a delamination issue, which may occur during a bending step, is effectively prevented.

While some exemplary embodiments of the disclosures have been particularly shown and described, it will be understood by one of ordinary skill in the art that variations in form and detail may be made therein without departing from the spirit and scope of the attached claims.

What is claimed is:

1. A display device, comprising:
   a display panel; and a window coating layer disposed directly on an upper surface of the display panel,
wherein
the window coating layer comprises a first region which has an increasing elastic modulus in a direction from the display panel toward the window coating layer,
the window coating layer further comprises a second region and a third region, which are spaced apart from each other in the direction from the display panel toward the window coating layer with the first region interposed therebetween, and
each of the second region and the third region has a constant elastic modulus.

2. The display device of claim 1, wherein the window coating layer comprises two or more kinds of base resin.

3. The display device of claim 1, wherein
the second region defines an upper surface of the window coating layer,
the third region defines a lower surface of the window coating layer in contact with the upper surface of the display panel, and
the second region has an elastic modulus higher than an elastic modulus of the third region.

4. The display device of claim 3, wherein
the second region has an elastic modulus in a range from 1 GPa to 10 GPa, and
the third region has an elastic modulus in a range from 1 MPa to 100 MPa.

5. The display device of claim 3, wherein the second region has a thickness in a range from about 5 μm to about 20 μm.

6. The display device of claim 1, wherein the window coating layer has a thickness in a range from about 50 μm to about 1 mm.

7. The display device of claim 6, wherein the window coating layer has a thickness in a range from about 100 μm to about 500 μm.

8. The display device of claim 1,
wherein the window coating layer has a single-layer structure,
wherein the window coating layer further comprises a second region and a third region, which are spaced apart from each other in the direction from the display panel toward the window coating layer with the first region interposed therebetween, and
wherein each of the second region and the third region has a constant elastic modulus.

9. The display device of claim 1, wherein the window coating layer comprises an ultraviolet absorber.

10. The display device of claim 1, wherein an upper surface of the window coating layer defines irregular bumpy patterns.

11. The display device of claim 1, wherein the display panel comprises:
a base layer;
a pixel layer disposed on the base layer and used to display an image;
an input-sensing layer disposed on the pixel layer and which senses an external input; and
an anti-reflection layer disposed on the pixel layer and which prevents a reflection of an external light,
wherein the window coating layer is disposed directly on an upper surface of the outermost layer of the input-sensing layer and the anti-reflection layer.

12. The display device of claim 1, further comprising:
a base coating layer disposed directly on a lower surface of the display panel.

13. The display device of claim 12, wherein the base coating layer comprises a single kind of base resin.

14. The display device of claim 1, wherein
the display device is operated in a first mode, in which at least a portion of the display device is bent, or in a second mode, in which the display device is flat.

15. The display device of claim 1, wherein the first region has a non-vanishing elastic modulus gradient.

16. A display device, comprising:
a display panel;
a window coating layer disposed directly on an upper surface of the display panel,
a first curl prevention pattern, which is disposed directly on the upper surface of the display panel to be in contact with the window coating layer and which prevents a curl of the window coating layer,
wherein
the window coating layer comprises a first region which has an increasing elastic modulus in a direction from the display panel toward the window coating layer.

17. The display device of claim 16, wherein the first curl prevention pattern is covered with the window coating layer.

18. A display device, comprising:
a display panel; and
a window coating layer disposed on an upper surface of the display panel, wherein the window coating layer has a single-layer structure,
wherein the window coating layer has a plurality of elastic moduli after curing of the window coating layer,
wherein the window coating layer further comprises a second region and a third region, which are spaced apart from each other in the direction from the display panel toward the window coating layer with the first region interposed therebetween, and
wherein each of the second region and the third region has a constant elastic modulus.

19. The display device of claim 18, wherein the window coating layer comprises a first region having an increasing elastic modulus in the direction from the display panel toward the window coating layer.

20. The display device of claim 18, wherein the window coating layer comprises two or more kinds of base resin.

* * * * *